United States Patent [19]

Sakai

[11] Patent Number: 5,001,077

[45] Date of Patent: Mar. 19, 1991

[54] METHOD OF PRODUCING AN ASYMMETRICALLY DOPED LDD MESFET

[75] Inventor: Masayuki Sakai, Itami, Japan

[73] Assignee: Mitsubishi Denki Kabushiki Kaisha, Japan

[21] Appl. No.: 493,457

[22] Filed: Mar. 14, 1990

[30] Foreign Application Priority Data

Nov. 8, 1989 [JP] Japan .................................. 1-290643

[51] Int. Cl.⁵ .......................................... H01L 21/265
[52] U.S. Cl. ...................................... 437/41; 437/912;
437/958; 437/44; 437/36; 148/DIG. 82
[58] Field of Search .................... 437/41, 44, 238, 912,
437/958; 148/DIG. 82, DIG. 102; 357/15, 22 I

[56] References Cited

U.S. PATENT DOCUMENTS

| | | | |
|---|---|---|---|
| 4,263,057 | 4/1981 | Ipri | 437/44 |
| 4,569,119 | 2/1986 | Terada et al. | 437/228 |
| 4,586,243 | 5/1986 | Weaver, II et al. | 29/458 |
| 4,645,563 | 2/1987 | Terada | 437/245 |
| 4,782,031 | 11/1988 | Hagio et al. | 437/912 |
| 4,855,246 | 8/1989 | Codella et al. | 437/912 |

FOREIGN PATENT DOCUMENTS 6773 6/1977 Japan ..................................... 437/41

107071 9/1988 Japan .

OTHER PUBLICATIONS

Geissberger, A. E. et al., "A New Refractory Self Aligned Gate Technology for GaAs Microwave Power FET's and MMIC's", IEEE Trans. Elect. Dev, p. 615, vol. 35, #5 (May 88).

"A Self-Aligned Planar... MMICs", 1987 Proceedings of the IEEE GaAs IC Symposium, pp. 45-48.

Primary Examiner—Brian E. Hearn
Assistant Examiner—Linda J. Fleck
Attorney, Agent, or Firm—Leydig, Voit & Mayer

[57] ABSTRACT

A method for producing a compound semiconductor device includes covering all but the top part of an electrode comprising a refractory metal or refractory metal silicide disposed on a compound semiconductor substrate with an insulating film, producing a photoresist which completely covers the insulating film at a first side of the electrode, the top part of the electrode, and at part of a second side of the electrode using the photoresist as a mask and removing the insulating film at the second side of the electrode, removing the photoresist, and ion implanting using the insulating film remaining at the first side of the electrode and the electrode as masks.

5 Claims, 4 Drawing Sheets

FIG. 4.
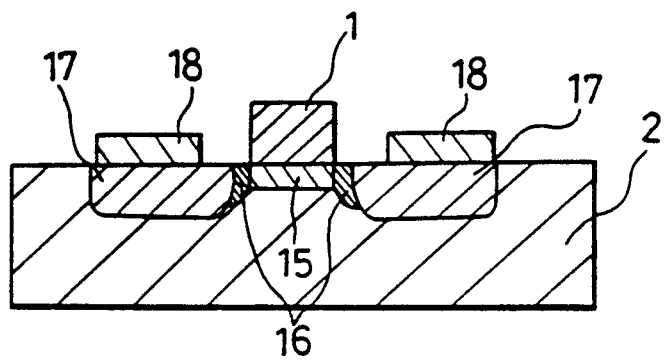
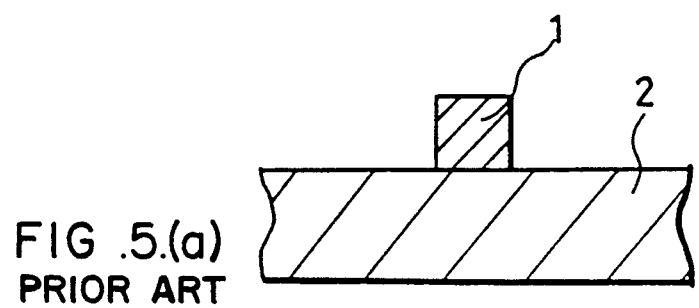
FIG. 5.(a)
PRIOR ART
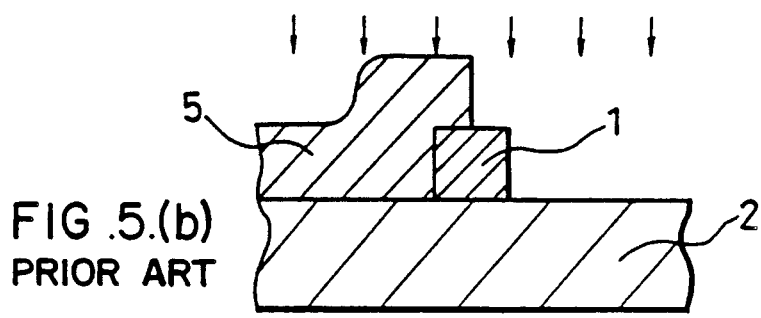
FIG. 5.(b)
PRIOR ART
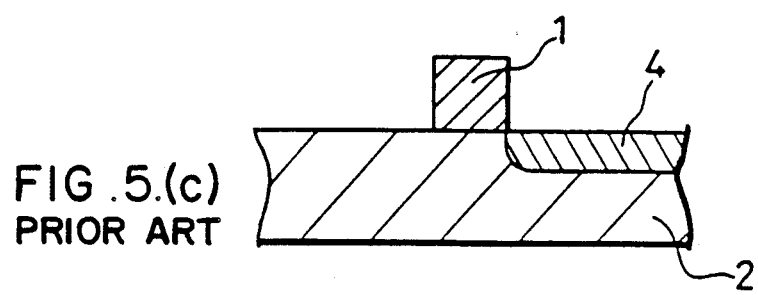
FIG. 5.(c)
PRIOR ART

METHOD OF PRODUCING AN ASYMMETRICALLY DOPED LDD MESFET

FIELD OF THE INVENTION

The present invention relates to a method of producing a compound semiconductor device and, more particularly to a method for asymmetrical ion implantation relative to a refractory metal electrode of a compound semiconductor device.

BACKGROUND OF THE INVENTION

FIGS. 5(a) to 5(c) are cross-sectional views showing a prior art method for asymmetrical ion implantation relative to a refractory metal or a refractory metal silicide electrode. In the figures a refractory metal or a refractory metal silicide electrode 1 is disposed on a compound semiconductor substrate 2. Reference numeral 5 denotes a photoresist covering substrate 2 at only one side of the electrode 1 and a portion of electrode 1. Reference numeral 4 denotes a region of the substrate 2 in which ions are implanted using the resist 5 and the electrode 1 as a mask.

A production method of the device will be described.

First of all, as shown in FIG. 5(a), a refractory metal or a refractory metal silicide is deposited on the entire surface of the compound semiconductor substrate 2 and etched to produce a desired configuration of electrode 1.

Next, as shown in FIG. 5(b), a photoresist 5 is deposited and paterned by photolithography so that one side of the electrode 1 is completely covered from the top surface of the electrode 1 to the substrate 2. Thereafter, ions are implanted using the photoresist 5 and the electrode 1 as a mask.

Subsequently, as shown in FIG. 5(c), after the photoresist 5 is removed, activate the implanted impurity ions are activated by annealing, thereby to produce an active region 4.

Thus, a semiconductor device having an active region at only one side of the refractory metal or refractory metal silicide electrode is completed.

In the prior art method, the photoresist 5 is used as a mask for ion implantation relative to the refractory metal or refractory metal silicide electrode 1. Therefore, it is necessary to pattern the photoresist 5 in alignment with the top surface of the electrode 1 which is difficult when the electrode is narrower than the mask alignment precision. For example, when the mask alignment precision is in a range of ±0.2 micron, the width of the electrode must be at least 0.4 micron to adjust the edge of the photoresist 5 to the center of the electrode 1. Actually, an electrode finer than 0.6 micron cannot be produced.

SUMMARY OF THE INVENTION

It is an object of the present invention to provide a method of stably producing a mask for asymmetrical ion implantation relative to an electrode narrower than the mask alignment precision.

It is another object of the present invention to provide a high efficiency compound semiconductor device having an asymmetrical impurity concentration distribution relative to the gate electrode, which can be produced by the above-described production method.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, the parts other than the top surface of a refractory metal or refractory metal silicide electrode are completely covered by an insulating film, a photoresist is deposited covering the top surface of the electrode and the insulating film at one side thereof with a margin which is larger than the mask alignment precision. The insulating film at one side of the electrode is removed by isotropic etching using the photoresist and the electrode as a mask. An ion implantation uses the electrode and the insulating film remaining at the other side of the electrode as a mask. Therefore, a mask alignment can be obtained with a sufficient margin for stably covering the top surface of the refractory metal or refractory metal silicide electrode independently of the size of the refractory metal or refractory metal silicide electrode. Furthermore, the insulating film at one side of the electrode can be removed by isotropic etching using the electrode itself as a mask.

According to another aspect of the present invention, an electrode comprising refractory metal or refractory metal silicide is produced on an active layer on a compound semiconductor substrate surface, an ion implantation uses the electrode as a mask, and the parts other than the top surface of the electrode are covered by a first insulating film. The first insulating film at the other side of the electrode is completely removed using a photoresist which covers the top surface of the electrode and the first insulating film at one side thereof as a mask, an ion implantation uses the electrode and the remaining first insulating film as a mask. Side walls comprising a second insulating film are produced at both sides of the electrode, and an ion implantation uses the electrode and the side walls as a mask, thereby producing a compound semiconductor device having an asymmetrical impurity concentration distribution with respect to the electrode. Therefore, the impurity concentrations at the drain side and the source side can be established independently of each other.

BRIEF DESCRIPTION OF THE DRAWINGS

FIG. 4 is a cross-sectional view showing an LDD structure FET having a symmetrical impurity concentration distribution according to a prior art; and FIGS. 5(a) to 5(c) are cross-sectional views showing the steps of asymmetrical ion implantation according to the prior art.

DETAILED DESCRIPTION OF THE PREFERRED EMBODIMENTS

Figure 1:
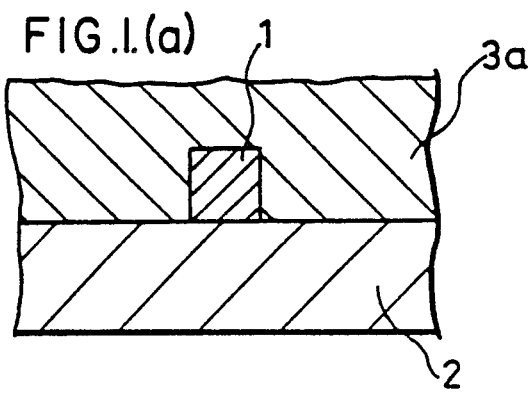
FIGS. 1(a) to 1(f) are cross-sectional views showing the main process steps for producing a compound semiconductor device according to a first embodiment of the present invention.
Figure 1:
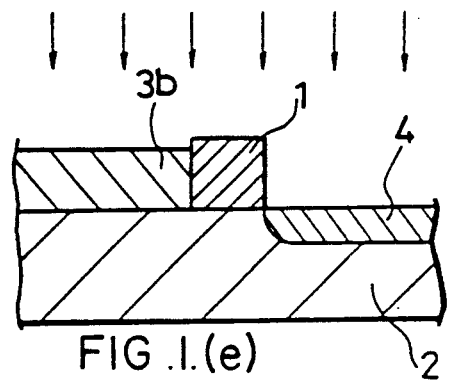
Figure 1:
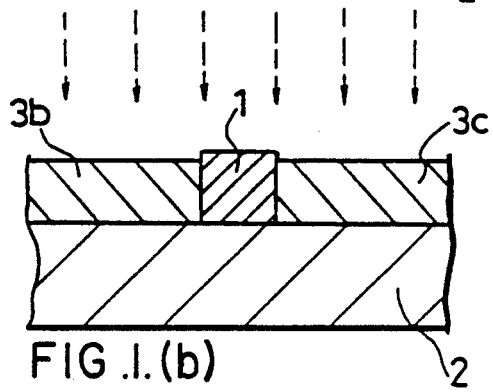
Figure 1:
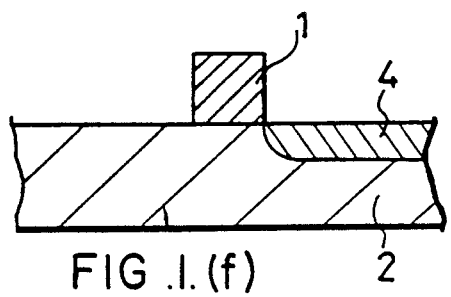
Figure 1:
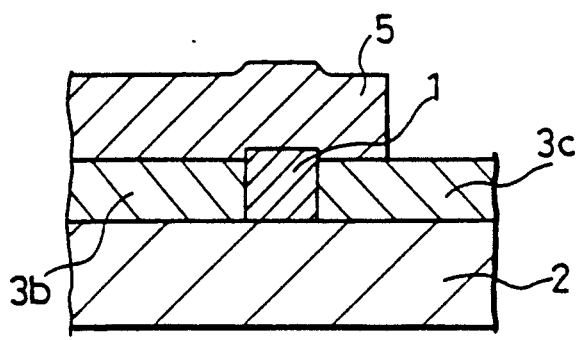
Figure 1:
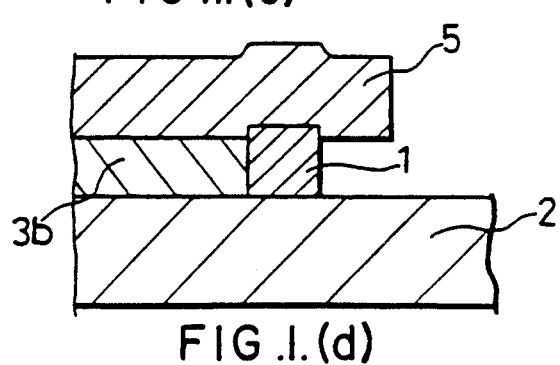
Figure 2:
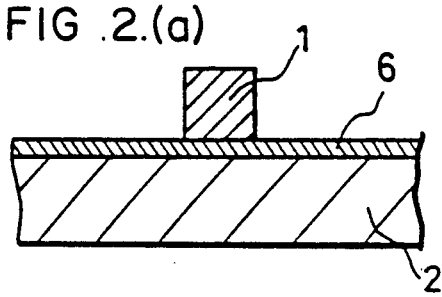
FIGS. 2(a) to 2(h) are cross-sectional views showing the application of the present invention to the production of an LDD structure FET having an asymmetrical impurity concentration distribution.
Figure 2:
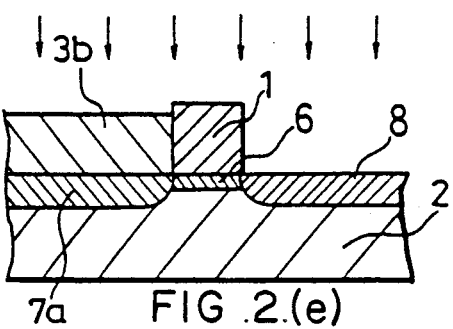
Figure 2:
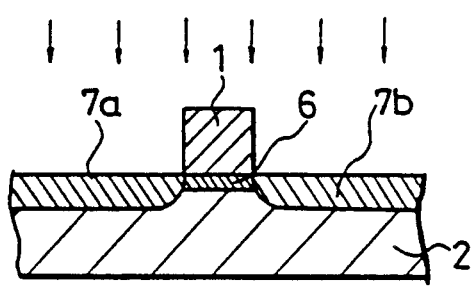
Figure 2:
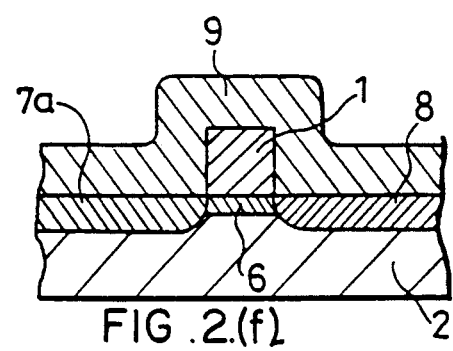
Figure 2:
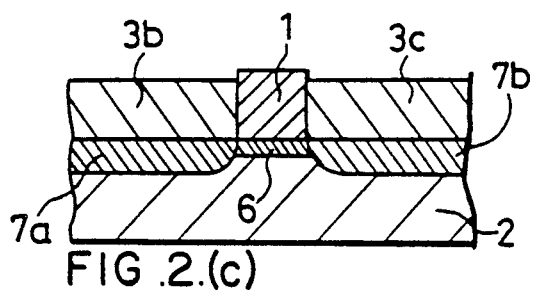
Figure 2:
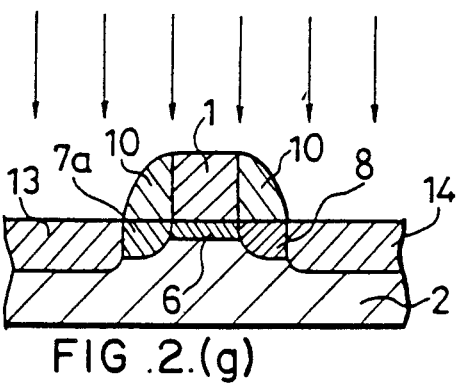
Figure 2:
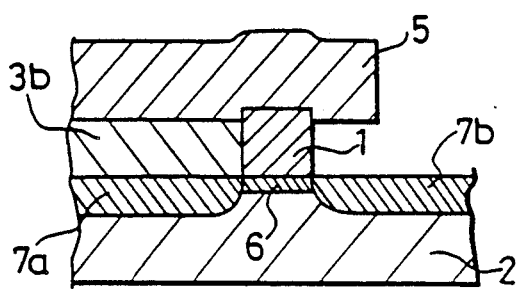
Figure 2:
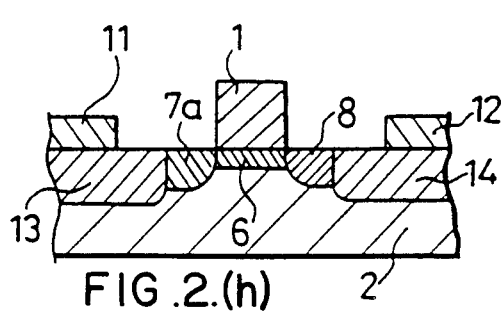

An embodiment of the present invention will be described in detail with reference to the drawings.

FIGS. 1(a) to 1(f) are cross-sectional views showing main process steps for producing a compound semiconductor device according to an embodiment of the present invention. In FIG. 1, electrode 1 comprising a refractory metal or a refractory metal silicide is disposed on a compound semiconductor substrate 2. Reference numerals 3a, 3b, and 3c denote insulating layers. Reference numeral 4 denotes an ion implantation layer produced in the substrate 1. Reference numeral 5 denotes a photoresist.

A production method will be described with reference to FIG. 1.

First of all, as shown in FIG. 1(a), a refractory metal such as tungsten (W) or molybdenum (Mo), or a refractory metal silicide such as tungsten silicide (WSi) or molybdenum silicide (MoSi) is deposited to a thickness of approximately 3000 Angstroms on a compound semiconductor substrate 2, such as GaAs, and etched to produce a gate electrode 1 of a desired gate length. Thereafter, an insulating film 3a having a flat surface is deposited on the substrate 2 to completely cover the electrode 1 by the bias Electron Cyclotron Resonance CVD method (hereinafter referred to as bias ECR-CVD method).

Next, as shown in FIG. 1(b), the insulating film 3a is etched by reactive ion etching or sputter etching, thereby to expose the top of the electrode 1. Thus, a structure, in which the parts other than the top of the electrode 1 is completely covered by the insulating films 3b and 3c, is obtained.

Next, as shown in FIG. 1(c), a photoresist 5 is deposited on the substrate and is patterned to completely cover the insulating film 3b at one side of the electrode 1 and the top of the electrode 1. The photoresist 5 is removed at the other side of the electrode 1.

Subsequently, as shown in FIG. 1(d), the insulating film 3c is completely removed by isotropic etching such as wet etching using hydrofluoric acid using the photoresist pattern 5 and the electrode 1 as a mask.

Then, as shown in FIG. 1(e), after the photoresist 5 is removed, ion implantation is preformed using the electrode 1 and the insulating film 3b remaining at one side as a mask.

Lastly, as shown in FIG. 1(f), after the insulating film 3b is removed, annealing is preformed to activate the implanted impurity ions.

In the above-described embodiment, the photoresist pattern 5 produced by photolithography is not used as a mask for ion implantation but is simply used as a mask for etching to remove the insulating film. Therefore, even when the pattern of refractory metal or refractory metal silicide electrode 1 is narrower than the mask alignment precision of photolithography, there is no problem in the precision of patterning.

Furthermore, since side etching of the insulating film 3c is stopped when it reaches the electrode 1 which functions as an etching mask, it is possible to remove the insulating film 3c self-aligningly with respect to the electrode 1 by appropriately controlling the amount of over-etching.

As described above, in this first embodiment, a mask for performing ion implantation asymmetrically with respect to the electrode narrower than the mask alignment precision of photolithography can be reliably produced.

While in the above-described first embodiment the compound semiconductor substrate 2 comprises GaAs, this may comprise other compound semiconductors.

FIGS. 2(a) to 2(h) show cross-sectional views of a production flow in a case where the present invention is applied to a production process for producing a so-called LDD structure MESFET. In FIG. 2, the same reference numerals as those shown in FIG. 1 denote the same or corresponding portions. An active layer 6 (hereinafter referred to as n layer) is disposed on the semiconductor substrate 2. Reference numerals 7a and 7b denote ion implantation layers having impurity concentration $n_1$ (hereinafter referred to as $n_1$ layer), produced in the active layer 6. Reference numeral 8 denotes an ion implantation layer having impurity concentration $n_2$ (hereinafter referred to as $n_2$ layer). Reference numeral 9 denotes an insulating film for forming a side wall. Side walls 10 are disposed at the both sides of the electrode 1. A drain electrode 11 and a source electrode 12 are disposed on a drain region 13 and a source region 14, respectively.

The production process will be described.

First of all, dopant ions, such as silicon ions, are implanted into the compound semiconductor substrate 2, such as GaAs, at an energy of 50 keV and concentration of $2 \times 10^{12}$ cm$^{-2}$ to produce an active layer (n layer) 6, and then annealing is performed. Thereafter, a refractory metal such as tungsten or molybdenum or a refractory metal silicide such as tungsten silicide or molybdenum silicide are deposited to a thickness of 3000 Angstroms on the entire surface of the substrate 2, and etched to produce a gate electrode 1 of a desired configuration (FIG. 2(a)).

Next, as shown in FIG. 2(b), silicon ions are implanted into the entire substrate at an energy of 50 keV and concentration of $1 \times 10^{12}$ cm$^{-2}$ using the gate electrode 1 as a mask, thereby to produce $n_1$ layers 7a and 7b at both sides of the electrode 1.

Next, as shown in FIG. 2(c), an insulating film having a flat surface is deposited on the entire surface, to completely cover the electrode 1 by a bias ECR-CVD method. The insulating film is etched by reactive ion etching or sputter etching thereby to expose a top part of the electrode 1 from the insulating film. Thus, a structure, in which the parts, other than the top part of the electrode 1, are completely covered by the insulating films 3b and 3c, is obtained.

Thereafter, as shown in FIG. 2(d), a photoresist pattern 5 of 1 micron thickness is deposited to completely cover the insulating film 3b at one side of the electrode 1 and the top part of the electrode 1. The photoresist is removed at the insulating film 3c at the other side of the electrode 1. Then, the insulating film 3c is removed by an isotropic etching such as wet etching using hydrofluoric acid.

Thereafter, as shown in FIG. 2(e), the photoresist 5 is removed and ion implantation is performed using the electrode 1 and the insulating film 3b remaining at one side thereof as a mask, thereby to produce the $n_2$ layer 8. This ion implantation is performed so that the impurity concentration of the $n_2$ layer 8 is larger than that of the $n_1$ layer 7a. For example, when silicon ions are implanted at the energy of 50 keV and a concentration of $1 \times 10^{12}$ cm$^{-2}$, the impurity concentration of the $n_2$ layer 8 becomes $2 \times 10^{12}$ cm$^{-2}$, while the impurity concentration of the $n_1$ layer 7a is $1 \times 10^{12}$ cm$^{-2}$.

Next, as shown in FIG. 2(f), the insulating film 3b remaining at one side of the electrode 1 is removed, and thereafter an insulating film 9 comprising silicon dioxide is deposited to a thickness greater than 3000 angstroms on the entire substrate.

Next, as shown in FIG. 2(g), the insulating film 9 is etched by RIE to produce side walls 10 at the both side of the electrode 1, and an ion implantation for producing the n+ layers 13 and 14 is performed using the electrode 1 and the side wall 10 as a mask. Herein, the ion implantation is performed under the condition that the impurity concentrations of the n+ layers 13 and 14 are significantly larger than that of the $n_2$ layer 8. That is, the relations of the concentrations of the respective ion implantation layers are selected such that the impurity concentration of n+ layer
>> the impurity concentration of $n_2$ layer
> the impurity concentration of $n_1$ layer
> the impurity concentration of n layer.

For example, as such an implantation condition, silicon ions maybe implanted at an energy of 60 keV and concentration of about $10^{13}$ cm$^{-2}$.

Then, as shown in FIG. 2(h), after the side wall 10 is removed, annealing is performed, and a drain electrode 11, such as AuGe/Ni/Au, is deposited on the n+ layer 13 at the side of the $n_1$ layer 7a. A source electrode 12 comprising AuGe/Ni/Au is produced on the n+ layer 14 at the side of the $n_2$ layer 8. Thus, a MESFET is completed.

As described above, a lightly dope drain (LLD) FET having an asymmetrical impurity concentration distribution is produced.

In this second embodiment, similarly as in the above-described first embodiment, since the photoresist pattern 5 produced by photolithography is simply used as a mask for removing the insulating film 3c, the mask alignment margin for the photolithography is not restricted by the pattern size of the electrode 1, and it is possible to have a sufficient margin for stably covering the top part of the electrode 1. Therefore, even when the pattern of the electrode 1 is narrower than the mask alignment precision, there arises no problem in the precision of patterning. Furthermore, because the insulating film 3c at one side of the electrode 1 is removed by etching using the photoresist 5 and the electrode 1 as a mask and the photoresist 5 is also removed, a mask for performing an asymmetrical ion implantation can be stably produced.

Furthermore, in the MESFET having the above-described structure, the drain side impurity concentration and the source side impurity concentration can be established independently, for the following goals:

(1) enhance the gate drain breakdown voltage ($BV_{GD}$); and (2) reduce the source resistance (to enhance the mutual conductance gm or the K-value of the FET)

These will be described in detail as follows.

A general LDD structure FET is shown in FIG. 4 for reference. This is a symmetrical LDD structure FET having n' layer 16 and n+ layer 17 which have equal impurity concentrations and are positioned symmetrically with respect to the active layer 15. That is, in the semiconductor device shown in FIG. 2(h), the $n_1$ layer 7a and the $n_2$ layer 8 have impurity concentrations which are equal to each other, and the concentrations thereof are n'.

Figure 3:
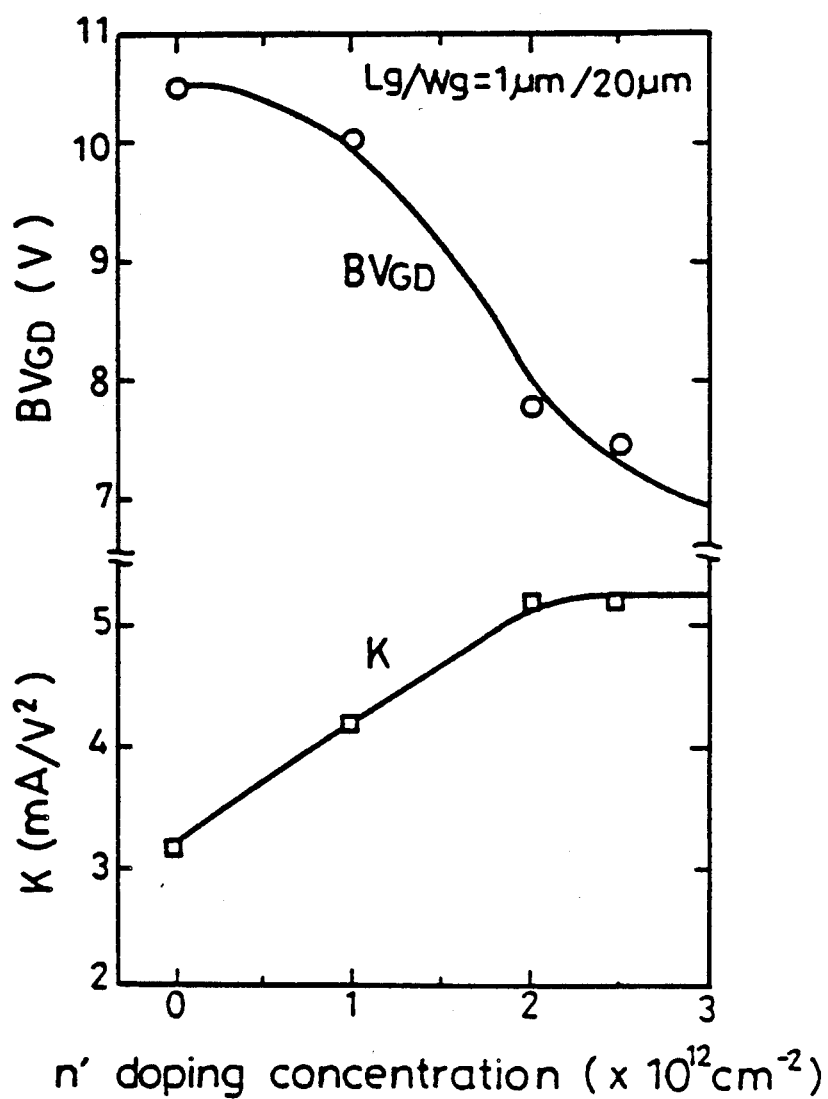
FIG. 3 is a diagram showing the relationship between the value K and gate - drain breakdown voltage $BV_{GD}$ of an FET and those quanties for an n layer of an LDD structure FET.

FIG. 3 is a graph showing the variations of the gate drain breakdown voltage $BV_{GD}$ and the K-value of the FET when the impurity concentration of the n' layer is varied in the LDD structure FET which has a symmetrical configuration with respect to the electrode 1. As shown in FIG. 3, when the impurity concentration n' is increased, the K-value increases and the breakdown voltage $BV_{GD}$ decreases. In the prior art symmetrical structure shown in FIG. 4, the concentration of the n' layer is established at the value which is equal to the source side and the drain side. The concentrations have to be established by a compromise between the K-value and the gate drain breakdown voltage $BV_{GD}$.

On the contrary, in the present embodiment, the impurity concentrations of the n' layer can be established independently to be $n_2$ and $n_1$ respectively at the source side and the drain side. Therefore, the impurity concentration $n_2$ at the source side is increased to increase the K-value, and the impurity concentration $n_1$ at the drain side is reduced to sufficiently increase the gate drain breakdown voltage.

In the production condition of the above-described second embodiment, the impurity concentration of the $n_1$ layer 7a is $1 \times 10^{12}$ cm$^{-2}$ and the impurity concentration of the $n_2$ layer 8 is $2 \times 10^{12}$ cm$^{-2}$. Therefore, the gate to drain breakdown voltage $BV_{GD}$ can be established at 10 V and the K-value can be established at about 5 mA/V$^2$ from FIG. 3, and therefore, it is possible to enhance the gate drain breakdown voltage and to reduce the source resistance (to enhance the K-value).

As is evident from the foregoing description, according to the present invention, while producing a mask for asymmetrical ion implantation relative to the refractory metal or refractory metal silicide electrode, the mask is made of an insulating film and the insulating film is patterned into the configuration of the mask using a photoresist pattern which has a sufficient margin for the photolithography. Therefore, even when the electrode is made smaller, a mask can be produced stably.

Furthermore, while producing a compound semiconductor device having an asymmetrical impurity concentration distribution with respect to the gate electrode using such a method, the impurity concentrations at the source side and the drain side can be independently established, the source resistance can be reduced, and the gate to drain resistance can be enhanced, thereby producing a high efficiency compound semiconductor device with high precision.

What is claimed is:

1. A method for producing a compound semiconductor device comprising:
   producing an active layer in a compound semiconductor substrate;
   producing an electrode of one of a refractory metal and a refractory metal silicide on the active layer;
   performing a first ion implantation using said electrode as a mask;
   covering said substrate and electrode except the top part of said electrode with a first insulating film;
   producing a photoresist covering said top part of said electrode, said first insulating film at a first side of the electrode, and part of said first insulating film at a second side of said electrode;
   using said photoresist as a mask, removing said first insulating film at the second side of said electrode;
   removing said photoresist and performing a second ion implantation using said electrode and said first insulating film remaining at the first side of said electrode as masks;

removing said first insulating film remaining at the first side of said electrode and producing a side wall of a second insulating film at both sides of said electrode; and performing a third ion implantation using said electrode and said side walls as masks.

2. A method as defined in claim 1 including producing impurity concentrations $n_1$, $n_2$, and $n^+$ in the first, second, and third ion implantation processes, respectively, such that $n_1 > n_2 > n^-$.

3. A method as defined in claim 1, wherein said compound semiconductor substrate is GaAs.

4. A method as defined in claim 1 including removing said first insulating film at the second side by isotropic etching.

5. A method as defined in claim 4, including isotropic etching with hydrofluoric acid.

* * * * *